United States Patent [19]

Monnier

[11] Patent Number: 4,871,583
[45] Date of Patent: Oct. 3, 1989

[54] HOUSING FOR AN ELECTRONIC DEVICE

[75] Inventor: Michel J. Monnier, Montgeron, France

[73] Assignee: U.S. Philips Corporation, New York, N.Y.

[21] Appl. No.: 68,735

[22] Filed: Jun. 30, 1987

Related U.S. Application Data

[62] Division of Ser. No. 809,633, Dec. 16, 1985, abandoned.

[30] Foreign Application Priority Data

Dec. 21, 1984 [FR] France ................................ 84 19660

[51] Int. Cl.⁴ .............................................. B05D 5/12
[52] U.S. Cl. ...................................... 427/96; 427/123; 29/842; 29/845
[58] Field of Search ..................... 427/96, 123; 29/842, 29/845

[56] References Cited

U.S. PATENT DOCUMENTS

| | | | |
|---|---|---|---|
| 3,007,997 | 11/1961 | Panariti ............................ | 361/414 X |
| 3,331,912 | 7/1967 | Stricker et al. .................. | 174/52 FP |
| 3,509,624 | 5/1970 | Boucher ............................ | 174/68.5 |
| 3,548,494 | 12/1970 | Haring ............................... | 427/96 |
| 3,549,784 | 12/1970 | Hargis ............................... | 174/68.5 |

(List continued on next page.)

FOREIGN PATENT DOCUMENTS 56-19648  2/1981  Japan ..................................... 357/80
.1489031 10/1977  United Kingdom .

OTHER PUBLICATIONS

J. G. Ameen, G. V. Elmore, "Protective Coating for Integrated Circuitry", IBM Technical Disclosure Bulletin, vol. 19, No. 9, p. 3348, Feb. 1977.

R. R. Dean, "A New Role for Tin in Electronics", Quarterly Journal of the International Tin Research Institute, No. 116, 1978, pp. 1–6.

F. R. Christie, P. W. Schuessler, "Epoxy Sealant", IBM Technical Disclosure Bulletin, vol. 19, No. 1, 1976, p. 91, Jun.

"Surface-Mounted Array Type Plastic Chip Carrier", IBM Tech. Discl. Bul., vol. 27, No. 7A, Dec. 1984, pp. 3669-3672.

Primary Examiner—Shrive Beck
Assistant Examiner—Vi Duong Dang
Attorney, Agent, or Firm—Paul R. Miller

[57]  ABSTRACT

The invention relates to a housing for an electronic device including a ceramic substrate 120 on which a multilayer circuit 110 is deposited by screen-printing. The circuit serves to bring about the connection between the terminals 7 of the electronic device and mounting pins 2 of the housing, which are provided in metallized holes in the substrate. The holes are provided with conducting rings (11 and 12) by means of screen-printing the conducting layers are formed from a compound which can be screen-printed and which comprises, at least, copper and a vitreous-crystalline material. This compound is to be fired in a neutral atmosphere at a temperature which is lower than the melting temperature of copper. Insulating layers are formed from a vitreous-crystalline screen-printable compound which must be fired in a neutral atmosphere at a temperature which is suited for the conducting layers with the insulating compound having a coefficient of expansion which is adapted to that of the substrate up to its firing temperature. The last layer of the circuit is a protective insulating vitreous-crystalline layer. The pins have the shape of a shank provided with a flat head, which flat head rests on the ring which is located at one of the faces of the substrate, and the pins are fixed by means of a metal alloy which is compatible with the metal coating of the holes and conducting rings with the melting temperature of the alloy being substantially the same or lower than the firing temperature of the circuit layers. The terminals of the electronic device located on the substrate are connected to the ends of the conductors by means of flexible wires, with the ends being left free during manufacture of the multilayer circuit. The electronic device is protected by a cap.

17 Claims, 2 Drawing Sheets

U.S. PATENT DOCUMENTS

| | | | |
|---|---|---|---|
| 3,660,726 | 5/1972 | Ammon et al. | 174/68.5 |
| 3,735,211 | 5/1973 | Kapnias | 174/52 FP X |
| 3,740,920 | 6/1973 | Lane | 174/52 FP |
| 3,802,892 | 4/1974 | Pirooz | 252/512 X |
| 3,808,680 | 5/1974 | Lafrate et al. | 174/68.5 X |
| 3,825,805 | 7/1974 | Belohoubeck et al. | 357/80 |
| 3,871,018 | 3/1975 | Jackson et al. | 174/52 FP X |
| 3,911,570 | 10/1975 | Smith | 29/842 |
| 3,936,866 | 2/1976 | Grossman et al. | 357/80 |
| 3,999,004 | 12/1976 | Chirino | 427/96 |
| 4,025,716 | 5/1977 | Morse | 174/52 FP |
| 4,082,394 | 4/1978 | Gedney et al. | 357/80 X |
| 4,152,282 | 5/1979 | Baudry et al. | 501/67 |
| 4,172,919 | 10/1979 | Mitchell | 252/512 X |
| 4,234,367 | 11/1980 | Herron et al. | 427/96 X |
| 4,318,954 | 3/1982 | Jensen | 427/96 |
| 4,323,652 | 4/1982 | Baudry et al. | 501/17 |
| 4,371,744 | 2/1983 | Badet et al. | 361/414 X |
| 4,446,477 | 5/1984 | Currie et al. | 357/80 X |
| 4,490,429 | 12/1984 | Tosaki et al. | 427/96 X |
| 4,513,355 | 4/1985 | Schroeder et al. | 357/80 X |
| 4,515,304 | 5/1985 | Berger | 228/180.1 X |
| 4,535,012 | 8/1985 | Martin | 427/96 |
| 4,541,035 | 9/1985 | Carlson et al. | 361/414 |
| 4,588,456 | 5/1986 | Dery et al. | 174/117 FF X |
| 4,608,592 | 8/1986 | Miyamoto | 174/52 FP |

HOUSING FOR AN ELECTRONIC DEVICE

This is a division of application Ser. No. 809,633, filed Dec. 16, 1985, now abandoned.

The invention relates to a housing for an electronic device including a ceramic substrate on which a multilayer circuit is deposited by screen-printing using materials which are alternately conductors and insulators. This circuit serves to bring about the connection between the terminals of the electronic device which is secured to the substrate and the mounting pins of housing provided in metallized holes in the substrate. These holes are provided on each side of the substrate with conducting rings with the metallization of the holes and the rings being carried out by screen-printing using a conducting material compatible with the conducting material of the multilayer circuit.

The invention finds its application in the construction of housings for integrated circuits having a large number of input and output terminals. The most important qualities which the housings should possess are ease of manufacture, production efficiency, low cost, electric reliability and mechanical strength, such that they can be produced in mass and sold world-wide.

A device comprising such a multilayer circuit is known from U.S. Pat. No. 3,549,784. The device described in this Patent comprises a multilayer circuit obtained by screen-printing on a ceramic substrate, for example, of aluminium oxide. This circuit is formed of layers which are alternately conductors and insulators with the conducting layers consisting of networks of conductors and the insulating ones serving to embed the conductors.

The insulating layers are made of a ceramic which is compatible with that of the substrate. After the different layers have been formed in accordance with the structure wanted for the circuit, the composite structure of the ceramic substrate, of the metallic non-fired layers and of the insulating ceramic layers is heated in an atmosphere of hydrogen and nitrogen to a temperature of 1630° C. for two hours in order to bake the ceramic and metallic components. The structure thus obtained is called "co-fired".

In accordance with this Patent the pins of devices or the connection pins may be introduced into metallized holes in the substrate, after which they are soldered. Metallization of the holes and formation of one of the conducting layers of the circuit is done at the same time and using the same material. The material is diffused in the holes by reflowing. The Patent does not state any metal composition which is suitable for soldering or hard-soldering.

The use of such a co-fired structure in the manufacture of the base of the housing has an important disadvantage. The disadvantage resides in that the structure obtained is warped instead of flat. The Patent states that this problem can be solved by applying a metallic layer to the other side of the substrate at such a location that the deformations caused by the structure of the upper side are counteracted.

Meanwhile, it is stated in an article headed "Narumi va automatiser la fabrication de ses substrats céramiques multicouches "co-cuits", published by J. P. Della Mussia in Electronique Actualités No. 722 of 2 Nov. 1984 that the average yield of "co-fired" ceramic substrates is not higher than 30% because due to firing the dimensions are reduced by shrinkage with a maximum of 17% which often leads to breakage of the conductors.

This major disadvantage is due to the fact that the adopted technology implies firing at a very high temperature, which, moreover, leads to other disadvantages.

Firing at a very high temperature renders imperative the use of refractory metals, such as tungsten or a molybdenum-manganese alloy, to form the conducting layers. These metals are poor conductors of electricity. In accordance with the Patent, other metals such as platinum or palladium may be used and fired in air at much lower temperature. However, apart from the fact that these metals are very expensive, a still very high temperature of at least 1300° C. is needed to sinter the ceramic insulating layers. In these circumstances, a metal such as copper, which is a far better conductor and is a lot cheaper, cannot be used because its melting point is well below the above-stated temperature.

Consequently, the proposed circuit whose structure should solve, as stated in the article of Della Mussia, the problem of the ease of manufacture of the base of the housing thanks to the fact that no more than one firing process would be needed, and which structure should solve the problem of the mechanical strength thanks to the fact that the insulating layers are of ceramic, leads in fact to the opposite result: the manufacturing costs are raised due to the fact that an output as low as 30% is obtained and that expensive materials are used, and the required mechanical strength is not attained because these circuits are subject to breakage of the conductors.

On the other hand, sealing of the pins poses serious problems which have not been solved by the stated Patent. Moreover, the necessary sealing strength largely depends on the method used to pierce and metallize the holes and on the way the pins are fixed, in the holes by means of a sealing material. The strength equally depends on the shape of the pin.

Finally, mounting of the electronic device on the base of the housing and tightly or hermetically sealing a protective cap for this component forms yet another problem. This problem is not solved by the stated Patent.

For this reason, the present invention proposes solutions to the problem of manufacturing these housings which are significantly different from the solutions described in the prior art.

In accordance with the present invention, this problem is solved by a housing as defined in the opening paragraph, characterized in that the conducting material is a compound which can be screen-printed and which is formed from, at least, copper and a vitreous-crystalline material, which compound is to be fired in a neutral atmosphere at a temperature which is lower than the melting temperature of copper, in that the insulating material is a vitreous-crystalline screen-printable compound which must be fired in a neutral atmosphere at a temperature which is suited for the conducting material with the insulating material having a coefficient of expansion which is adapted to that of the substrate up to its firing temperature, in that the last layer of the circuit is a protective insulating vitreous-crystalline layer, in that the pins have the shape of a shank provided with a flat head, which shank passes through the holes in the substrate and sufficiently projects from one of the faces to ensure a proper fixation of the housing with the flat head resting on the ring which is located at the other side of the substrate, in that the pins are fixed by means of a metal alloy compatible with the metal coating of the holes and conducting rings and having a melting temperature substantially the same or lower than the firing temperature of the circuit layers, in that the terminals of the electronic device located on the substrate are connected to the ends of the conductors by means of flexible wires, which ends are left free during the manufacture of the multilayer circuit, and in that the electronic device is protected by a cap.

A method for the manufacture of such a housing is also proposed. This method being characterized in that it comprises the following stages:

(a) forming a ceramic substrate, (b) piercing holes in the substrate to accommodate the mounting pins of the housing while providing an area for the accommodation of the electronic device, (c) metallizing the holes and forming conducting rings around the holes on each side of the substrate with these operations being carried out by screen-printing using a conducting ink which is made of, at least, copper and a vitreous-crystalline material, and which is to be fired in a neutral atmosphere at a temperature lower than the melting temperature of copper, and which operations comprise depositing an amount of conducting ink at the location of the opening of the holes, diffusing the ink in the holes, for example by reflowing, and firing the layers thus obtained, (d) depositing a first conducting layer according to such a pattern that conductors are formed for interconnecting part of the terminals of the electronic device to part of the pins, leaving free the area for accommodating the electronic device, with the deposition being carried out by screen-printing using a conducting ink comprising copper, which ink is identical to or compatible with the ink used for metallizing the holes and the rings, and firing the layer, (e) depositing an insulating layer according to such a pattern that two successive conducting layers are isolated, thereby leaving free the area for accommodating the electronic device as well as the conducting rings and the ends of the conductors which are located opposite the terminals of the device, with the deposition being carried out by means of screen-printing using an insulating vitreous-crystalline ink which is to be fired in a neutral atmosphere at a temperature compatible with that of the conducting ink, and with the ink having a coefficient of expansion which is very close to that of the substrate up to the firing temperature of the layer, and firing the layer, (f) alternately depositing conducting and insulating layers, respectively, according to such a pattern that the network of conductors necessary for interconnecting the terminals of the electronic device and the pins of the housing is obtained, thereby leaving free the area for accommodating the electronic device as well as the conducting rings and the ends of the conductors located opposite the terminals of the device with these deposition processes being carried out by means of screen-printing using types of ink which are by turns conductive and insulative, and which are identical to or compatible with the types of ink which form the preceding layers with the last layer being a protective insulating layer and firing the layers one by one, (g) temporarily protecting the zones which are formed by the area for accommodating the electronic device and the ends of the conductors located opposite the area, using a varnish which is resistant to the solder used for firing the pins, (h) locating the metal pins which consist of a shank provided with a flat head with the shank going through the substrate at the location of the holes thereby sufficiently projecting from one of the faces to ensure a proper fixation of the housing with the flat head being supported by the ring located at the other face of the substrate, and subsequently, soldering the pins using a metal alloy which is compatible with the metal coating of the holes and rings with the melting temperature being lower than or substantially equal to the firing temperature of the circuit layers, (i) removing the protective varnish, (j) locating and fixing the electronic device in the area reserved at the substrate, (k) providing flexible metal wires between the terminals of the electronic device and the ends of the conductors of the multilayer circuit which are left free, and (l) fixing the protective cap of the electronic device.

The multilayer circuit obtained by means of vitreous-crystalline layers having a firing temperature well below that of the ceramic layers and having a coefficient of expansion which is adapted to that of the substrate up to the firing temperature, with the layers being fired one by one, exhibits qualities which are very much superior to those of the co-fired ceramic circuits. The bases on which the circuits are provided are devoid of tension and, consequently, they are not warped. Thus, it is not necessary to provide additional layers to counteract warping. The connections between the layers and the networks of connectors are strong and electrically reliable.

Carrying out a firing process each time a layer has been deposited, does not render more complicated or more expensive the manufacture of the base of the housing because the application of low temperatures and the use of cheap materials make it possible to substantially reduce costs, while the yield is close to 100%.

The electric quality of the circuits is also very much improved thanks to the use of copper as a conducting material with the conductivity of copper being 10 times that of, for example, tungsten.

The shape of the pins and the sealing material used ensure that the pins are correctly mounted on the housing. In this way, a very good mechanical strength and a perfect electric connection are obtained, both essential characteristics of a housing, by using simple and low-cost materials.

Thanks to, in particular, the mounting of the pins and the protective cap of the electronic component using methods recommended by the invention a tightly or even hermetically sealed housing is obtained which is resistant to high temperatures and, thus, meets the highest requirements.

The invention will now be explained in greater detail by means of the following description which is illustrated by the accompanying drawings, in which.

Each of the Figures shows substantially a cross-sectional view through one half of the housing with the part not shown being symmetrical to the part shown as regards the arrangement of the elements forming the housing.

Figure 1:
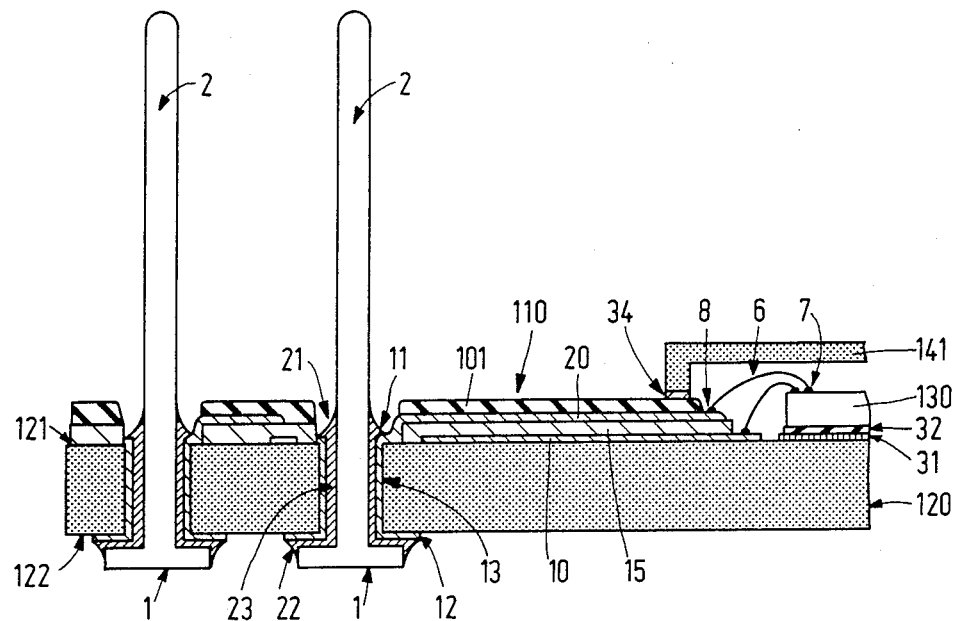
FIG. 1 is a sectional view of a part of a housing in accordance with the invention.

The sectional view of FIG. 1 shows that the housing in accordance with the invention comprises a ceramic substrate 120 whose central part supports an electronic device 130 and a multilayer circuit 110 which ensures the electric connections between the electronic device and the pins 2. A cap 141 which may be made of a ceramic material warrants the protection of the electronic device.

Figure 2:
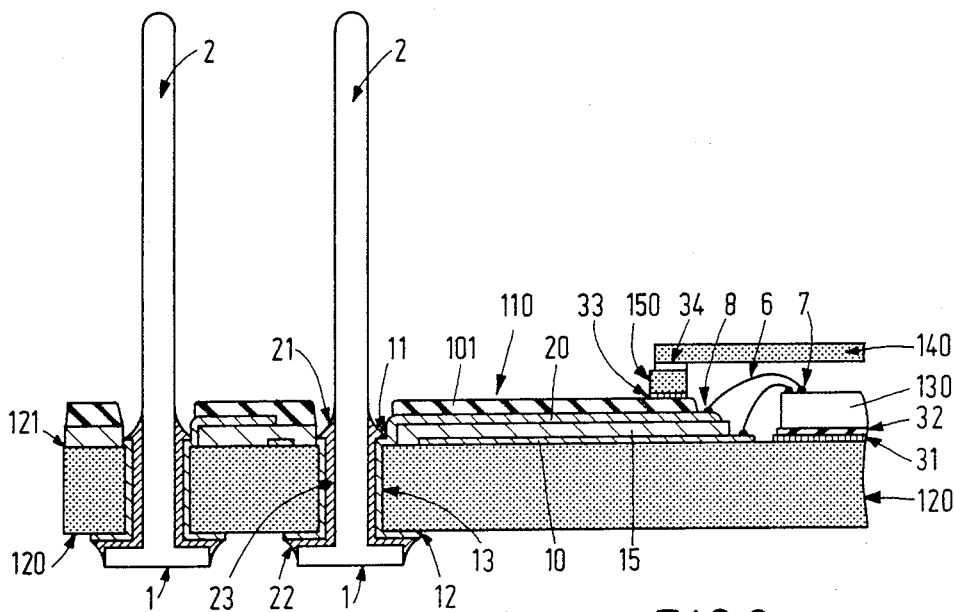
FIG. 2 is a sectional view of an alternative embodiment of the same part of the housing in accordance with the invention; and The FIGS. 3A and 3B are sectional views of the same part of the housing in accordance with the invention and of the alternative embodiment at various stages of the manufacturing process.

In accordance with an alternative embodiment of the housing as shown in FIG. 2, the cap consists of two parts, a spacer 150 and a cover 140.

Usually, the electronic device 130 is a very large scale integrated circuit (VLSI) which is provided on a semiconductor material and comprises a large number of input and output terminals 7. Presently, the number of terminals amounts to approximately 144. However, due to the increasing demand for ever more complex circuits, the number of terminals may rise to 300 in the near future.

Figure 3A:
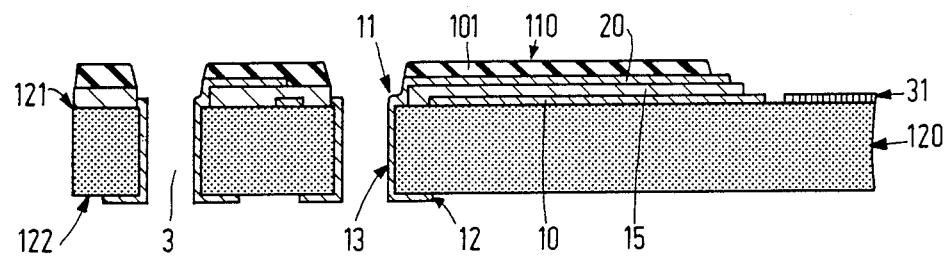

The housing which contains the device is connected to an electronic assembly, generally a printed circuit board, either by means of a pin grid array socket or directly, by soldering the housing onto the board. In either case, the electric and mechanical connections are made by pins 2 which are introduced in holes 3 in the substrate 120, as shown in FIG. 3A.

The number of pins 2 is at least equal to the number of terminals 7 of the electronic device. The large number and the requirement of a minimum spacing to avoid short-circuits, when the housing is connected to an external device, render it impossible to place all the pins in line with one another. Consequently, they are distributed over various rows at the periphery of the substrate.

The connection between the metal pins 2 and the terminals 7 of the electronic device is ensured on the one hand by the network 110 of the conductors which are screen-printed on the substrate 120, and on the other by flexible metal wires 6, which connect the end 8 of the conductors to the said terminals 7.

The number of conductors which should reach 300, and the pitch between their ends 8 which is in the order of magnitude of one tenth of a mm, necessitate the use of several levels to form the screen-printed network 110. Consequently, each conductor level 10, 20, . . . comprises a part of the conductors which contact a part of the pins 2, and is separated from the next conductor level by an electrically insulating layer 15 which, moreover, may be provided with openings for interconnecting two contiguous conductor levels. The network as a whole thus forms a multilayer circuit.

In order to overcome the problems which are inherent in the type of multilayer circuit selected to produce the prior art housing, a new type of screen-printable material is used to produce the housing of the invention and a new production method is proposed.

In accordance with the invention, a conducting compound which can suitably be used to form a screen-printable ink for providing the conductor layers 10, 20, . . . comprises copper powder and a vitreous binder. The ink obtained by means of this compound may be fired in a non-oxydizing atmosphere, for example nitrogen, at a temperature lower than the melting temperature of copper.

A conducting compound which meets these requirements may be, for example, the compound described in GB-A-1,489,031 or the British patent specification No. 2,037,270.

On the other hand, the insulating compound which may suitably be used to form a screen-printable ink for providing the insulating layers 15, has at least one vitreous phase. The ink obtained by means of the compound may be fired in a neutral atmosphere, for example nitrogen, at a temperature which is suited for the ink used to form the conducting layers 10, 20, . . . .

An insulating compound which meets these requirements may be, for example, the compound described in U.S. Pat. No. 4,152,282 or in U.S. Pat. No. 4,323,652.

The different compounds stated are very suitable for the manufacture of the housing in accordance with the invention because they meet the requirements, since their firing temperature in nitrogen ranges from 850° C. to 950° C. and they are compatible with each other. Besides, they have many advantages.

The copper-containing conducting layers thus obtained exhibit a very good electric conductivity of about 1.5 milliohms per square for conductors having a thickness of 20 $\mu$m (20 microns).

The insulating vitreous-crystalline layers have a coefficient of thermal expansion which is very close to that of the ceramic substrate up to their firing temperature. Consequently, the housings obtained are perfectly flat. Due to the fact that the different layers forming the housings are free from mechanical stress, the yield is close to 100%.

It is to be noted however, that the composition of both the conducting and the insulating layers, as given by way of example, renders it necessary for the layers to be fired one by one. However, the low firing temperature and the low cost of the materials used make it possible to attain low manufacturing costs.

Preferably, an insulating-protective layer 101 is formed on the last conducting layer by means of a composition which may suitably be used to form a screen-printable ink having a vitreous phase, and which can be fired at a low temperature of about 550° C. This firing process must be carried out in a non-oxydizing atmosphere. An insulating compound which meets the said requirements may be, for example, the compound described in U.S. patent application Ser. No. 745,734, now U.S. Pat. No. 4,684,543 (or EP-A-85200960.4).

In an example of an embodiment, each conductor layer is formed in one screen-printing operation and has a thickness of about 15 $\mu$m after firing.

Each insulating layer, which separates two conducting layers, is formed in two steps including an intermediate firing process, and after the final firing the thickness amounts to approximately 40 $\mu$m.

As shown in FIG. 3A, the holes 3 in the substrate 120, into which the pins 2 are introduced, may be formed by different methods, such as by using a laser beam or by boring.

The latter method is to be preferred because of its simplicity and because the inner sides of the holes have the same surface condition as that of the substrate and, consequently, can be directly subjected to the metal-plating process which is necessary in view of the subsequent mounting of the pins.

Laser-boring, however, causes a superficial vitrification of the inner sides of the holes, thus forming a poorly adhering crackled layer. This layer may be removed, for example, by subjecting it to a thermal treatment. It is alternatively possible to deposit two layers of the metal described below on the inner sides of the holes, the first layer containing an increased amount of up to 10% by weight of the vitreous binder and the second layer containing a normal amount (approximately 2% by weight of the vitreous binder).

After a substrate has been provided with holes the metallization of the holes, using a copper-containing ink which is identical to or compatible with the ink used for the conducting layers 10, is carried out preferably, prior to the formation of the multilayer circuit. For this purpose, the screen-printable ink used for metallizing is, for example, diffused into the hole 3 by reflowing so as to cover the walls of this hole, after which the ink is fired. In the same process, screen-printed conducting rings 11 and 12 are provided around the holes 3 on each of the faces 121 and 122, respectively, of the substrate 120.

A metal area 31 on which the electronic device 130 is to be mounted, is provided to the central part of face 121 of the substrate, for example, by means of a copper-containing ink as stated above. The multilayer circuit is fabricated on the same face 121 around the electronic device and the shanks of the pins 2 project equally from the face 121. Such an arrangement makes it possible to leave free the second face 122 of the substrate, thus providing space for fitting a radiator which dissipates the heat produced by the electronic device and which adversely affects the service life of the components of the electronic device. The radiator is not shown in the Figures because it does not form part of the invention.

The protective cap of the electronic device may be formed from a hollow part 141, as shown in FIG. 1, or from a spacer 150 and a cover 140, as shown in FIG. 2.

Generally, fitting the cap 141 or the cover 140 is the last operation in the manufacture of the housing. But if the cap consists of two parts, the spacer 150 is fitted on the protective layer 101, by means of a layer 33 which is identical to or compatible with the layer 101, consequently this operation is carried out at a low temperature of approximately 550° C. Thus, the use of a two-part housing excludes all but one method of fitting the pins, which method will be described later on in the text and according to which the temperature will not surpass 550° C. because, preferably, the spacer 150 is fitted on the layer 101 prior to fitting the pins.

A different shape is proposed for the pins to avoid their being pulled out which may happen when, after the housing has been mounted, it is lifted from its base several times in succession, for example during testing of the electronic device. In accordance with the invention, the pins have the shape of a shank with a flat head, that is to say, the pin has about the shape of a nail with a flat head. The pin is introduced into the metallised hole 3 so that the flat head 1 rests on the second face 122 of the substrate with the diameter of the head 1 being superior to the diameter of the hole 3. The shank of the pin sufficiently projects from the face 121 to ensure, for example, that the housing is suitably fitted to its base or that the housing is suitably soldered to a printed board.

Due to their particular shape, the pins of the housing in accordance with the invention are highly resistant to extraction. A metal which is suitable for forming pins is, for example, iron-nickel-cobalt.

When the electronic device is fragile, as is often the case, the pins are soldered before the electronic device is mounted on its mounting area. Consequently, the mounting area 31 and the ends 8 of the conductors must be protected during the soldering process. This can be accomplished by applying a few drops of a synthetic-resin varnish which is resistant to the solder in question and which leaves no trace after it is removed, i.e. it must not obstruct the subsequent soldering of the elements.

Products suitable for this purpose are, for example, a varnish which can be peeled off or a co-polymeric varnish of methyl-butyl polymethacrylate which can be dissolved in acetone. These products may also be used to protect the finished housing during the time it is stored.

For actually fixing the pins on the prepared substrate, as described above, three methods are proposed by way of example. Each of the methods includes the previous tin-plating of the pins, for example, by electro-deposition.

Figure 3B:
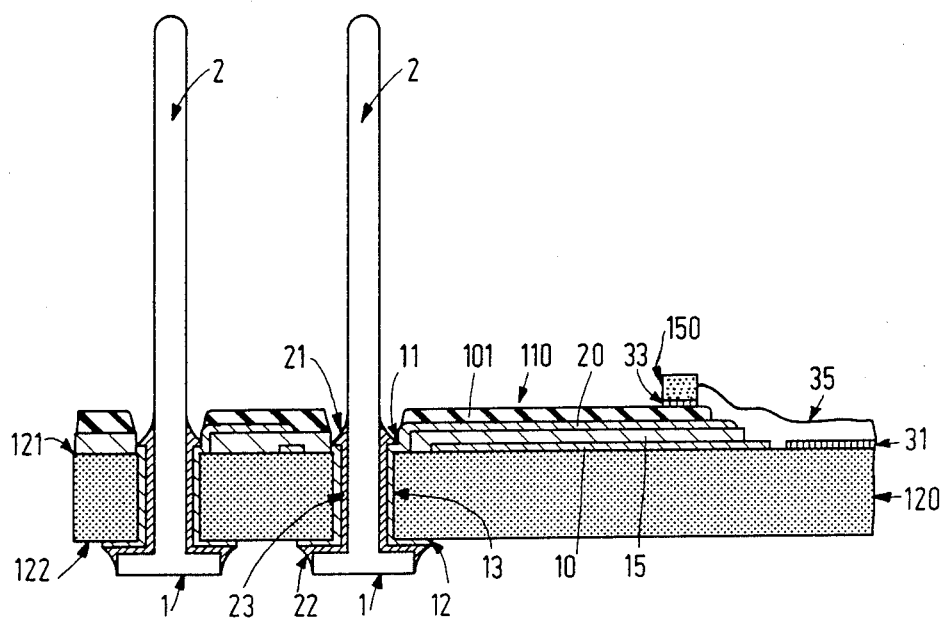

In accordance with the first method, the pins are soldered using a (60/40) tin/lead solder which settles at the location 23, as shown in the FIGS. 1, 2 or 3B. This method comprises positioning of the previously tin-plated pins 2 in the holes 3, their retention using an assembling process which is not described because it does not form part of the invention, and fixing the pins using solder. This may be done by immersing the pins in a solder bath containing the above-mentioned tin/lead mixture, for 5 to 8 seconds at a temperature of 230° C., using a non-activated flux. Another technique called "wave soldering" may also be used. After purifying the flux and removing the protective varnish from the metal areas, the base of the housing thus formed may be provided with the device 130, the connecting wires 6 and the protective cap 141 as shown in FIG. 1 where the cap is in one piece 141 or with the protective cap as shown in FIG. 2 where the cap is made of two component parts 140, 150.

Meanwhile, the metal coating of the holes 13 and of the rings 11 and 12 may be oxidized. If so, they must be treated prior to soldering the pins, which treatment for the removal of the oxide from the surface of the copper layers may be selected from the treatments known to those skilled in the art. Possible treatments are, for example, immersing the base of the housing in a solution containing 120 g/l of ammonium persulphate to which 5 g/l of sulphuric acid are added, rinsing in deionized water, drying in compressed air and subsequently in a nitrogen atmosphere in an oven at 80° C.

In carrying out the subsequent operations necessary to finish the housing, the temperature at which the pins have been fixed must be taken into account.

This is the reason why in accordance with the first method of fixing the pins, the electronic device is mounted by bonding together its rear end and the copper mounting area, using a silver conducting-adhesive. The bonding process is carried out in an oven, in a nitrogen atmosphere to avoid oxidation of the copper.

Next, the gold wires 6 are provided which interconnect the terminals 7 and the ends 8 of the conductors. This wiring process may be carried out, for example, using an ultrasonic-soldering machine with or an ultrasonic-welding machine, the ends of the conductors being free of oxidation.

The last operation consists in providing the hollow cap 141 or the cover 140. When the first method of fixing the pins is used, this last operation consists of applying a prepolymerized epoxy adhesive on the edge of the cap or cover and fixing the relevant element by means of polymerization in a nitrogen atmosphere for 15 minutes at a temperature of 150° C. Thus, a very good sealing of the cap is obtained.

The housing obtaining by this first method which includes the fixation of the pins using a tin/lead solder at a temperature of 230° C. and the fixation of the cap using an epoxy adhesive, can only be mounted on the printed board through the use of the spacer called "pin grid array socket". Directly soldering the housing onto the printed board would require a second flow soldering process, i.e. for 5 to 10 seconds at a temperature of 240° C. However, this temperature is higher than the melting temperature of the tin/lead solder when heated for the second time, which is 183° C. Consequently, the solder used for soldering the pins, in accordance with the first method, is not resistant to the soldering process in which the housing is soldered directly onto the printed board.

For this reason, the present invention proposes a second and a third method of fixing the pins.

In accordance with the second method, an additional metal coating is applied to the copper rings 11 and 12 prior to the fixation of the pins, which metal coating is applied by screen-printing an ink which comprises a (10%/88%/2% by weight, respectively) a tin/lead silver alloy, and which contains an averagely active flux which is necessary to suitably moisten the copper. The flux is applied to each side of the substrate so that the supply of a sufficient amount of the alloy to properly fill-up the space 23 (FIGS. 1, 2 and 3B) between the inner side of the hole and the pin is ensured as well as to ensure the formation of fillets 21 and 22 between the pin and the rings. Re-melting is carried out in a conveyor oven, in a nitrogen atmosphere, for 20 to 40 seconds at a temperature of 320° C. Consequently, the pins thus fixed are resistant to re-heating up to a temperature of 280° C. without the risk of melting.

When this second method for the fixation of the pins is used, the housing in accordance with the invention may be soldered onto the printed board. Meanwhile, the electronic device, the wires and the cap are fixed as described with regard to the first method.

In accordance with the third method of fixing the pins, round preforms having approximately the same shape and dimensions as the rings 12 are fabricated using a 71.15%/28.1%/0.75% by weight, respectively, silver/copper/nickel alloy. This ternary alloy has a temperature interval between solidity and liquidity which ranges from 780° C. to 795° C., thus, the melting cycle is not critical. Each pin is inserted in the corresponding metallized hole with the round preform being interposed between the nail-shaped head 1 of the pin and the face 122 of the substrate. The soldering process is carried out at high speed in a conveyor oven for about 30 seconds. The joints obtained with the 0.09 mm thick preforms are of a very good quality.

In accordance with this third method for the fixation of the pins, the electronic device is fitted on the mounting area by re-melting a silicon-gold eutectic at a temperature of 420° to 425° C. The gold wires are fixed by the method described hereinbefore, subsequently, the cap is secured using a gold/tin solder at 350° C., thus a hermetic sealing superior to that of the two other methods is ensured.

The different methods for the manufacture of the housing in accordance with the invention are described by way of non-limitative examples, however, other methods may be conceived without departing from the scope of the invention as defined in the appended Claims.

What is claimed is:

1. A method for the manufacture of a housing for an electronic device, characterized by the following steps:

(a) forming a ceramic substrate,
(b) piercing holes in the substrate to accommodate mounting pins of a housing and providing an area for accommodation of an electronic device,
(c) metallizing the holes and forming conducting rings around the holes on each side of the substrate, these operations being carried out by screen-printing using a conducting ink which is made of, at least, copper and a vitreous-crystalline material, said conducting ink being fired in a neutral atmosphere at a temperature lower than the melting temperature of copper, said operations comprising the steps of depositing an amount of said conducting ink at the opening of the holes, diffusing the ink in the holes by reflowing, and firing the layers of said conducting ink thus obtained,
(d) depositing a first conducting layer in a pattern to form conductors for interconnecting part of the terminals of the electronic device to part of the pins, leaving free the area for accommodating the electronic device, said deposition being carried out by screen-printing using a conducting ink comprising copper, said ink being identical to or compatible with the ink used for metallising the holes and the rings; and firing said first conducting layer,
(e) depositing an insulating layer in a pattern where two successive conducting layers are isolated, thereby leaving free the area for accommodating the electronic device as well as the conducting rings and the ends of the conductors located opposite the terminals of the electronic device, said deposition process being carried out by screen-printing using an insulating vitreous-crystalline ink fired in a neutral atmosphere at a temperature compatible with that of the conducting ink, said insulating ink having a coefficient of expansion very close to that of the substrate up to the firing temperature of said insulating layer, and firing said insulating layer.
(f) alternately depositing conducting and insulating layers, respectively, to form a multilayer circuit in a pattern of a network of conductors necessary for interconnecting the terminals of the electronic device and the pins of the housing, thereby leaving free said area for accommodating the electronic device as well as the conducting rings and the ends of the conductors located opposite the terminals of the device, said alternate deposition processes being carried out by screen-printing with types of ink being alternately conductive and insulative, said types of ink being identical to or compatible with the conducting and insulating ink forming the preceding layers, the last layer of said alternate layers being a protective insulating layer, and firing said alternating conducting and insulating layers individually one by one upon depositing each alternating layer,
(g) temporarily protecting the zones which are formed by the area for accommodating the electronic device and the ends of the conductors located opposite said area by using a varnish resistant to a solder used for fixing metal mounting pins,
(h) locating said metal mounting pins consisting of a shank provided with a flat head, said shank going through said substrate at the location of the holes, said pins sufficiently projecting from one of the faces to ensure a proper fixation of the housing, said flat head being supported by the conducting ring located at the other face of the substrate, and, subsequently, soldering the pins using a metal alloy which is compatible with the metal coating of the holes and rings at a melting temperature being lower than or substantially equal to the firing temperature of the multicircuit layers, (i) removing the protective varnish, (j) locating and fixing the electronic device in the area reserved at the substrate, (k) providing flexible metal wires between the terminals of the electronic device and the ends of the conductors of the multilayer circuit which are left free, and (l) fixing as protective cap over the electronic device.

2. A manufacturing method, as claimed in claim 1, of a housing characterized in that the substrate is made of aluminium oxide.

3. A manufacturing method, as claimed in claim 1 or 2, characterized in that the pins are made of iron-nickel-cobalt and that the surface is tin-plated.

4. A manufacturing method, as claimed in claim 1 or claim 2, characterized in that a copper mounting area for mounting the electronic device is provided on the same face of the substrate as the multilayer circuit at the same time as a first conducting layer of said alternate conductive and insulating layers by screen-printing with a conducting copper-containing ink identical to or compatible with the conducting ink of the multilayer circuit.

5. A manufacturing method, in accordance with claim 1 or claim 2, characterized in that the pins are fixed using a tin/lead solder and non-activated flux by either "dip soldering" or "wave soldering" at a temperature of 230° C.

6. A manufacturing method, as claimed in claim 1 or claim 2, characterized in that the pins are fixed using a tin/lead/silver alloy which is included in a screen-printable ink comprising an averagely active flux, which fixation comprises depositing said ink on the rings on each side of the substrate, in an amount which suffices to fill up the interval between the inner side of the hole and the pin to form solder fillets between the pin and the rings, and comprising remelting of said alloy in a neutral atmosphere at a temperature of 320°.

7. A manufacturing method, as claimed in claim 4, characterized in that the electronic device is fitted on the mounting area using a conducting silver-adhesive followed by the application of heat in a neutral atmosphere.

8. A manufacturing method, as claimed in claim 4, characterized in that the protective cap of the device is in one piece, and is fixed by an epoxy adhesive which is polymerized in a neutral atmosphere at 150° C.

9. A manufacturing method, as claimed in claim 4, characterized in that the protective cap of the device is in two parts being a spacer and a cover, wherein the spacer is fitted on the protective layer of the multilayer circuit by means of the same ink as that used to form said protective layer and prior to said step of protecting the metal zones by a varnish, and wherein the cover is fitted on the spacer in the last operation in the manufacture of the housing using an epoxy adhesive, said epoxy adhesive being polymerised in a neutral atmosphere at a temperature of 150° C.

10. A manufacturing method, as claimed in claim 4, characterized in that the pins are fixed using a silver/copper/nickel alloy, wherein round preforms made of said alloy are inserted between the head of the pin and the face of the substrate which supports the head and wherein the soldering process is carried out at a temperature ranging from 780° C. to 795° C.

11. A manufacturing method, as claimed in claim 10, characterized in that the electronic device is fitted using a gold-silicon eutectic at a temperature ranging from 420° to 450° C.

12. A manufacturing method, as claimed in claim 10 or 11, characterized in that the protective cap of the electronic device is in one piece and is fixed on the protecting layer of the multilayer circuit by means of a gold/tin alloy at a temperature of 350° C.

13. A manufacturing method, as claimed in any one of the claims 1 or 2, characterized in that the flexible wires for connecting the terminals of the electronic device to the ends of the conductive layers of said multilayer circuit are made of gold, and in that they are fixed by an ultrasonic connecting method, with or without the use of heat.

14. A manufacturing method, as claimed in any one of the claims 1 or 2, characterized in that the mounting pins are introduced and fixed in the holes of the housing in such a way that the tips project from that side of the substrate which carries the multilayer circuit.

15. A manufacturing method, as claimed in any one of the claims 1 or 2, characterized in that the firing temperature of the insulating protective layer of the multilayer circuit is of the order of 550° C., and that the firing temperature of the other insulating and conducting layers is of the order of 850° C.

16. A manufacturing method, as claimed in any one of the claims 1 or 2, characterized in that the neutral atmosphere used to carry out the various stages of the procedure is a nitrogen atmosphere.

17. A manufacturing method, as claimed in any one of the claims 1 or 2, characterized in that the alternating conductor layers are obtained by means of a conducting layer of approximately 15 $\mu$m thickness, and in that the alternating insulating layers between conducting layers is obtained by superposing two insulating layers having a total thickness of approximately 40 $\mu$m.

* * * * *